United States Patent
Williams et al.

(10) Patent No.: US 9,414,496 B2
(45) Date of Patent: Aug. 9, 2016

(54) METHOD FOR A PRINTED CIRCUIT BOARD WITH AN ARRAY OF HIGH DENSITY AC COUPLING/DC BLOCKING CAPACITORS

(71) Applicant: Oracle International Corporation, Redwood City, CA (US)

(72) Inventors: Ricki Dee Williams, Temecula, CA (US); Ray Ping-kwan Chan, Cupertino, CA (US)

(73) Assignee: Oracle International Corporation, Redwood City, CA (US)

( * ) Notice: Subject to any disclaimer, the term of this patent is extended or adjusted under 35 U.S.C. 154(b) by 13 days.

(21) Appl. No.: 14/575,223

(22) Filed: Dec. 18, 2014

(65) Prior Publication Data

US 2016/0183373 A1  Jun. 23, 2016

(51) Int. Cl.
| | | |
|---|---|---|
| H01L 23/48 | (2006.01) | |
| H05K 1/18 | (2006.01) | |
| H05K 1/11 | (2006.01) | |
| H05K 1/02 | (2006.01) | |
| H05K 3/32 | (2006.01) | |
| H05K 3/00 | (2006.01) | |
| H05K 3/42 | (2006.01) | |

(52) U.S. Cl.
CPC .............. *H05K 1/181* (2013.01); *H05K 1/0298* (2013.01); *H05K 1/115* (2013.01); *H05K 3/0047* (2013.01); *H05K 3/32* (2013.01); *H05K 3/42* (2013.01); *H05K 2201/093* (2013.01); *H05K 2201/10015* (2013.01); *H05K 2201/10545* (2013.01)

(58) Field of Classification Search
CPC ......... H01L 33/32; H01L 33/62; H01L 33/06; H01L 27/3244; H01L 51/0058
USPC ............................................ 257/774; 438/629
See application file for complete search history.

(56) References Cited

U.S. PATENT DOCUMENTS

| | | | | |
|---|---|---|---|---|
| 6,072,690 A | * | 6/2000 | Farooq | H01G 4/30 257/E23.067 |
| 6,535,077 B1 | * | 3/2003 | Hiroshima | H01P 1/2056 333/134 |
| 2002/0105083 A1 | * | 8/2002 | Sun | H01L 21/486 257/758 |
| 2007/0124930 A1 | * | 6/2007 | Cheng | H05K 1/0222 29/852 |

* cited by examiner

*Primary Examiner* — Andy Huynh
(74) *Attorney, Agent, or Firm* — Polsinelli PC (57) ABSTRACT

Implementations of the present disclosure involve an apparatus and/or method for a large array of AC coupling/DC blocking capacitors on a printed circuit board (PCB) of a microelectronic circuit. The method provides for the placement of the blocking capacitors (and associated vias) to be placed on/through the PCB in a small area while yielding low crosstalk or interference between the vias. In one particular embodiment, the blocking capacitors are placed on the PCB in an alternating pattern, with a pair of blocking capacitors placed on the top side of the PCB followed by a pair of blocking capacitors on the bottom side of the PCB, and so on. Further, top side capacitor vias may be back-drilled from the bottom side and bottom side capacitor vias may be back-drilled from the top side.

20 Claims, 5 Drawing Sheets

METHOD FOR A PRINTED CIRCUIT BOARD WITH AN ARRAY OF HIGH DENSITY AC COUPLING/DC BLOCKING CAPACITORS

FIELD OF THE DISCLOSURE

Aspects of the present invention relate to computing systems and, more particularly, aspects of the present invention involve printed circuit board layouts of AC coupling/DC blocking capacitors of a microelectronic circuit.

BACKGROUND

Computers are everywhere in today's society. They come in all different varieties and can be found in places such as automobiles, laptops or home personal computers, banks, personal digital assistants, cell phones, and servers. In addition, as computers become more commonplace and software becomes more complex, there is a need for the computing devices to process more data at faster speeds using a smaller package and less power. As such, the area of a printed circuit board (PCB) of a computing system utilized by the components and portions of the computing system becomes a highly valuable commodity. In general, the less area of the PCB a computing system circuit uses, the smaller the computer system package may be. Alternatively, area not utilized by a computer system circuit may be used to enhance the circuit's performance through additional components of the circuit.

However, placing components or conductors of the PCB near each other may result in negative consequences in the performance of the circuit. For example, vias (or "via barrels") within the PCB provide electrical connections between layers of the PCB to carry signals or power between the layers. As such, high frequency signals may be carried along the vias through the PCB from one layer to another. However, a signal transmitted along a via may capacitively couple with another via that is located nearby. This capacitive coupling appears as noise in the signals being transmitted along the vias. Some coupling between vias in the PCB may affect the performance of the circuit such that errors in the computing system occur.

One method to reduce the capacitive coupling in the PCB is to space apart the components (such as the vias) along the PCB. In general, the distance between the vias is inversely related to the amount of capacitive coupling observed in the related signal. However, spacing apart the vias of the PCB consumes PCB area such that circuit and PCB designers typically must weigh the cost of consumed board area to the capacitive coupling of the circuit layout. It is with these and other issues in mind that various aspects of the present disclosure were developed.

SUMMARY

One implementation of the present disclosure involves a printed circuit board (PCB) or a computing system fabricated on a PCB comprising a top surface, a bottom surface opposite the top surface, a plurality of top side signal layers in an upper half of the PCB between the top surface and the bottom surface, and a plurality of bottom side signal layers in a lower half of the PCB between the top surface and the bottom surface. In addition, the PCB includes a first pair of top side blocking capacitors on the top surface electrically connected to a first pair of top side vias electrically connected to at least one of the plurality of top side signal layers of the PCB, a pair of bottom side blocking capacitors on the bottom surface electrically connected to a pair of bottom side vias electrically connected to at least one of the plurality of bottom side signal layers of the PCB, and a second pair of top side blocking capacitors on the top surface electrically connected to a second pair of top side vias electrically connects to at least one of the plurality of top side signal layers of the PCB. In one particular embodiment, the first pair of top side blocking capacitors, the pair of bottom side blocking capacitors, and the second pair of top side blocking capacitors arranged on the top surface and the bottom surface in an alternating pattern.

Another implementation of the present disclosure involves a method for fabricating a printed circuit board (PCB). The method includes the operations of mounting a first pair of top side blocking capacitors on a top surface of the PCB electrically connected to a first pair of top side vias electrically connected to at least one of a plurality of top side signal layers, the plurality of top side signal layers in an upper half of the PCB between the top surface and a bottom surface opposite the top surface. Other operations of the method include mounting a pair of bottom side blocking capacitors on the bottom surface of the PCB electrically connected to a pair of bottom side vias electrically connected to at least one of the plurality of bottom side signal layers in a bottom half of the PCB between the top surface and a bottom surface and mounting a second pair of top side blocking capacitors on the top surface of the PCB electrically connected to a second pair of top side vias electrically connected to at least one of the plurality of top side signal layers. In one particular embodiment, the first pair of top side blocking capacitors, the pair of bottom side blocking capacitors, and the second pair of top side blocking capacitors arranged on the top surface and the bottom surface in an alternating pattern.

DETAILED DESCRIPTION

Implementations of the present disclosure involve method for a large array of AC coupling/DC blocking capacitors on a printed circuit board (PCB) of a microelectronic circuit. The method provides for the placement of the blocking capacitors (and associated vias) to be placed on/through the PCB in a small area while yielding low crosstalk or interference between the vias. In one particular embodiment, the blocking capacitors are placed on the PCB in an alternating pattern, with a pair of blocking capacitors placed on the top side of the PCB followed by a pair of blocking capacitors on the bottom side of the PCB, and so on. Further, the vias associated with the top side placed capacitors connect to top side signal layers and the vias associated with the bottom side placed capacitors connect to bottom side signal layers. Also, top side capacitor vias may be back-drilled from the bottom side such that the via stub lengths does not extend down or into the center of the PCB. Likewise, the bottom side capacitor vias may be back-drilled from the top side such that the via stub lengths does not extend up or into the center of the PCB. Finally, the power layers at or near the center of the PCB may be shape isolated from the other power layers and converted to a ground plane to further isolate the top side capacitors and the bottom side capacitors. Through this method, the AC coupling/DC blocking capacitors may be arrayed on the PCB in a dense array that saves board space while decreasing the capacitive coupling occurring in the signals carried on the PCB of the microelectronic circuit.

Figure 1:
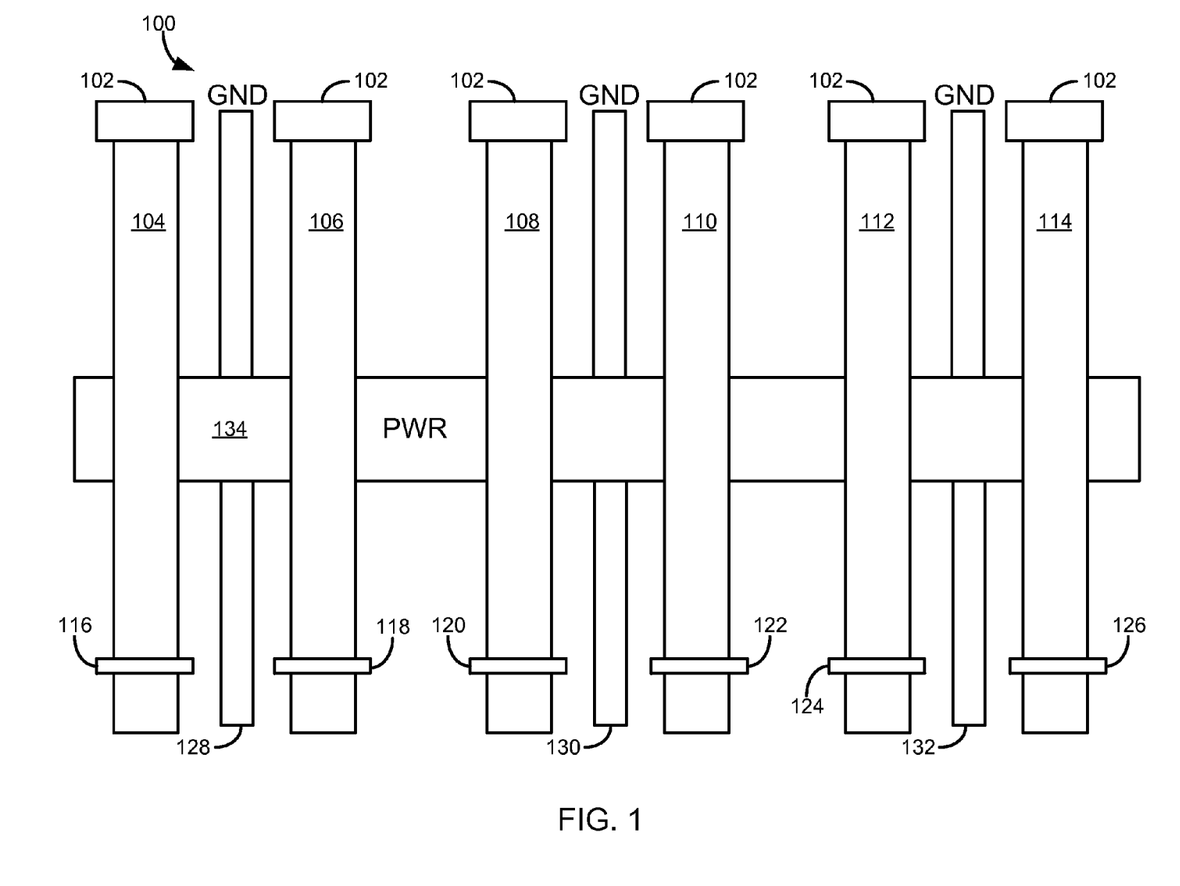
FIG. 1 is a cross-section view of a printed circuit board (PCB) illustrating a large array layout of AC coupling/DC blocking capacitors of a microelectronic circuit.

FIG. 1 is a cross-section view of a printed circuit board (PCB) illustrating a large array layout of AC coupling/DC blocking capacitors of a microelectronic circuit. In particular, the PCB 100 includes several AC coupling/DC blocking capacitors 102 arranged on a top side of the PCB. Associated with each blocking capacitor 102 is a via 104-114 within the PCB that provide electrical connections between layers of the PCB to carry signals or power from one layer of the PCB to another. In one example, the vias 104-114 may be formed by drilling a hole through the PCB 100 and copper plating (or plating with another conductive material) the drilled hole. To provide a path for a signal of the microelectronic circuit embodied in the PCB 100, the vias 104-114 may connect to a signal layer of the PCB. For example, via 104 electrically connects to signal layer 116, via 106 electrically connects to signal layer 118, and so on. In this manner, the signals transmitted on the associated signal layer 116-126 may be transmitted along the corresponding via 104-114 through the PCB 100 to connect to another signal layer or connect to the blocking capacitor 102 of the via.

In addition, a ground connected plane or ground connected via may be located between pairs of vias 104-114 to provide a vertical ground reference and lessen a capacitive coupling effect between the paired vias. For example, ground via 128 may be oriented between signal via 104 and signal via 106. Other ground vias 130-132 may also be included in the PCB 100 located between pairs of vias. Also, a power layer 134 is illustrated in the PCB 100 of FIG. 1.

Although shown in FIG. 1 as including six vias with corresponding blocking capacitors, it should be appreciated that a PCB housing a microelectronic circuit may include any number of such vias and blocking capacitors. Large arrays of blocking capacitors for some circuits may include hundreds of such vias. However, for simplicity sake, the figures and description included herein refer to but a few such blocking capacitors. Further, it should also be appreciated that the PCB and/or microelectronic circuit may include any number of additional components, signal or power layers, ground planes, and the like that may typically be included in a microelectronic circuit embodied on a PCB. Those of ordinary skill in the art will appreciate the many varied components and design options on PCBs of a circuit.

As mentioned above, several negative effects may occur in one or more vias 104-114 of the PCB that degrade the signals carried along the vias. For example, coupling may occur along the power layer 134 between vias, a via may encounter low impedance along the length of the via, a capacitor associated with a particular via may undergo capacitor loading, and the like. One particular type of capacitive coupling may occur between two or more vias 104-114 that are located near each other. For example, a high frequency signal transmitted along via 106 may interfere with a signal transmitted along via 108 that degrades the clarity of the signals of via 108. One method to combat this capacitive coupling is to space out the vias on the PCB 100. However, such a method consumes valuable PCB space while only providing a small decrease in the measured capacitive coupling in the via signals. In one particular example, the vias 104-114 may be spaced apart by 2 millimeters (mm) to address the capacitive coupling between near vias.

Figure 2:
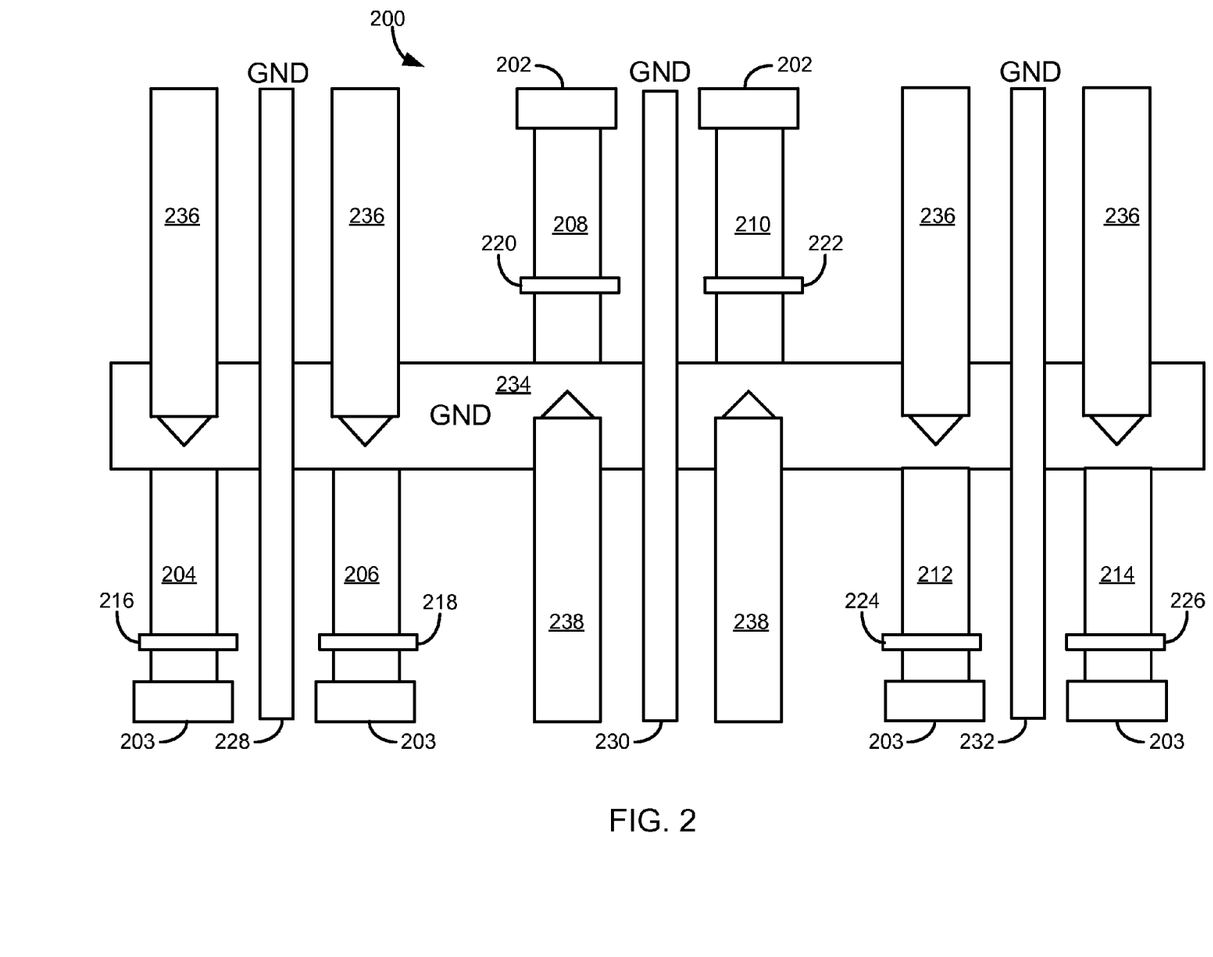
FIG. 2 is a cross-section view of a PCB illustrating one embodiment of the present disclosure for arranging a large array of AC coupling/DC blocking capacitors of a microelectronic circuit, including back-drilling of one or more vias of the large array.

FIG. 2 is a cross-section view of a printed circuit board (PCB) illustrating one embodiment of the present disclosure for arranging a large array of AC coupling/DC blocking capacitors of a microelectronic circuit, including back-drilling of one or more vias of the large array. Through the arrangement of the large array of AC coupling/DC blocking capacitors illustrated in FIG. 2, the via locations on the PCB 200 may be located closer together than in the arrangement illustrated in FIG. 1, thereby reserving or saving valuable PCB space while further reducing the amount of measured capacitive coupling in the signals carried through the vias.

The blocking capacitors 202,203 of the PCB 200 of FIG. 2 are arranged in an alternating top side/bottom side manner. In particular, the PCB 200 includes a pair of blocking capacitors 203 located on the bottom side of the PCB, followed by a pair of blocking capacitors 202 on the top side of the PCB. As such, rather than each blocking capacitor being located or attached to the PCB 200 on the same side (either all on the top surface of the PCB or all on the bottom surface), the blocking capacitors 202,203 of the PCB 200 follow an alternative pattern between a pair on the top surface or top side of the PCB and a pair on the bottom side. Additionally and similar to the embodiment of FIG. 1, one or more ground vias 228-232 may be located between pairs of blocking capacitors 202,203 and their respective vias.

In one embodiment, the placement of the blocking capacitors 202,203 on the top side and the bottom side of the PCB 200 in an alternating pattern may correspond to the signals carried through the vias associated with each blocking capacitor. For example, the top side blocking capacitors 202 may have associated vias 208,210, similar to the embodiment illustrated in FIG. 1. However, in the embodiment illustrated in FIG. 2, top side blocking capacitors vias 208,210 may electrically connect to signal layers 220,222 on the upper half of the PCB 200. As such, the PCB 200 and microelectronic circuit embodied in the PCB may be designed such that signal layers 220,222 in the upper half of the PCB connect to the blocking capacitors 202 placed on the top side of the PCB. Similarly, bottom side blocking capacitors vias may electrically connect to signal layers on the lower half of the PCB 200. For example, bottom side blocking capacitors vias 204, 206 associated with the bottom side blocking capacitors 203 may electrically connect to signal layers 216,218 on the lower half of the PCB 200. In this manner, the PCB 200 and microelectronic circuit embodied in the PCB may be designed such that signal layers 216,218 in the lower half of the PCB connect to the blocking capacitors 203 placed on the bottom side of the PCB. Lower half signal layers 224,226 are illustrated connecting to vias 212,214 of the bottom side blocking capacitors 203.

In addition to alternating the blocking capacitors 202,203 between the top side and the bottom side of the PCB 200, the embodiment of the PCB in FIG. 2 may also include back-drilling one or more of the vias 204-214 opposite the blocking capacitors 202,203 of the via. For example, via 204 includes a blocking capacitor 203 on the bottom side of the PCB 200. Thus, the via associated with the bottom side blocking capacitor 203 may be back-drilled 236 from the top side of the PCB to remove at least a portion of the via 204 from the PCB. In one particular embodiment, each of the vias associated with the bottom side blocking capacitors 203 are back-drilled 236 from the top side of the PCB to remove at least a portion of the via from the PCB. Similarly, one or more of the vias associated with the top side blocking capacitors 202 may be back-drilled 238 from the bottom side of the PCB 200 to remove at least a portion of the via from the PCB. As shown, because the top side blocking capacitor vias 208,210 connect to top side signal layers 220,222 of the PCB 200, back-drilling the vias from the bottom side of the PCB does not disconnect the vias from the connected signal layer. Similarly, because the bottom side blocking capacitor vias 204,206 connect to signal layers 216,218 in the bottom half of the PCB 200, back-drilling the vias from the top side of the PCB does not disconnect the vias from the connected signal layer.

As mentioned, the back-drilling 236,238 of the vias 204-214 of the blocking capacitors 202,203 may remove any portion of the vias. In one particular embodiment, the vias 204-214 are back-drilled such that the via stub length (the portion of the via remaining after back-drilling) does not extend into the interior of the PCB 200 past the center of the PCB. Thus, the stub length of bottom side via 204 may not extend past the center of the PCB 200 such that the entire stub length is in the lower half of the PCB and the stub length of top side via 208 may not extend past the center of the PCB such that the entire stub length is in the top half of the PCB. In one example not illustrated in FIG. 2, via 204 may be back-drilled 236 from the top of the PCB 200 to just above the signal layer 216 connected to the via, thereby removing the portion of the via from the signal layer to the top side of the PCB. In this example, the back-drilled 236 portion of the via 204 may be within 8 Mils of the signal layer 216.

Also, the embodiment of the PCB 200 of FIG. 2 provides for a ground layer 234 in the PCB. In contrast to the embodiment shown in FIG. 1 that includes a power layer 134 in the PCB 100, the PCB 200 of FIG. 2 includes a ground layer. In particular, during design of the PCB 200, power layers may be shaped within the PCB such that the power layers are isolated from the large array of blocking capacitors 202,203 of the PCB. Rather, a ground plane 234 may be located within the PCB 200 between the top side blocking capacitors 202 and the bottom side blocking capacitors 203. The ground plane 234 may act to further isolate the top side blocking capacitors 202 from the bottom side blocking capacitors 203.

Figure 3:
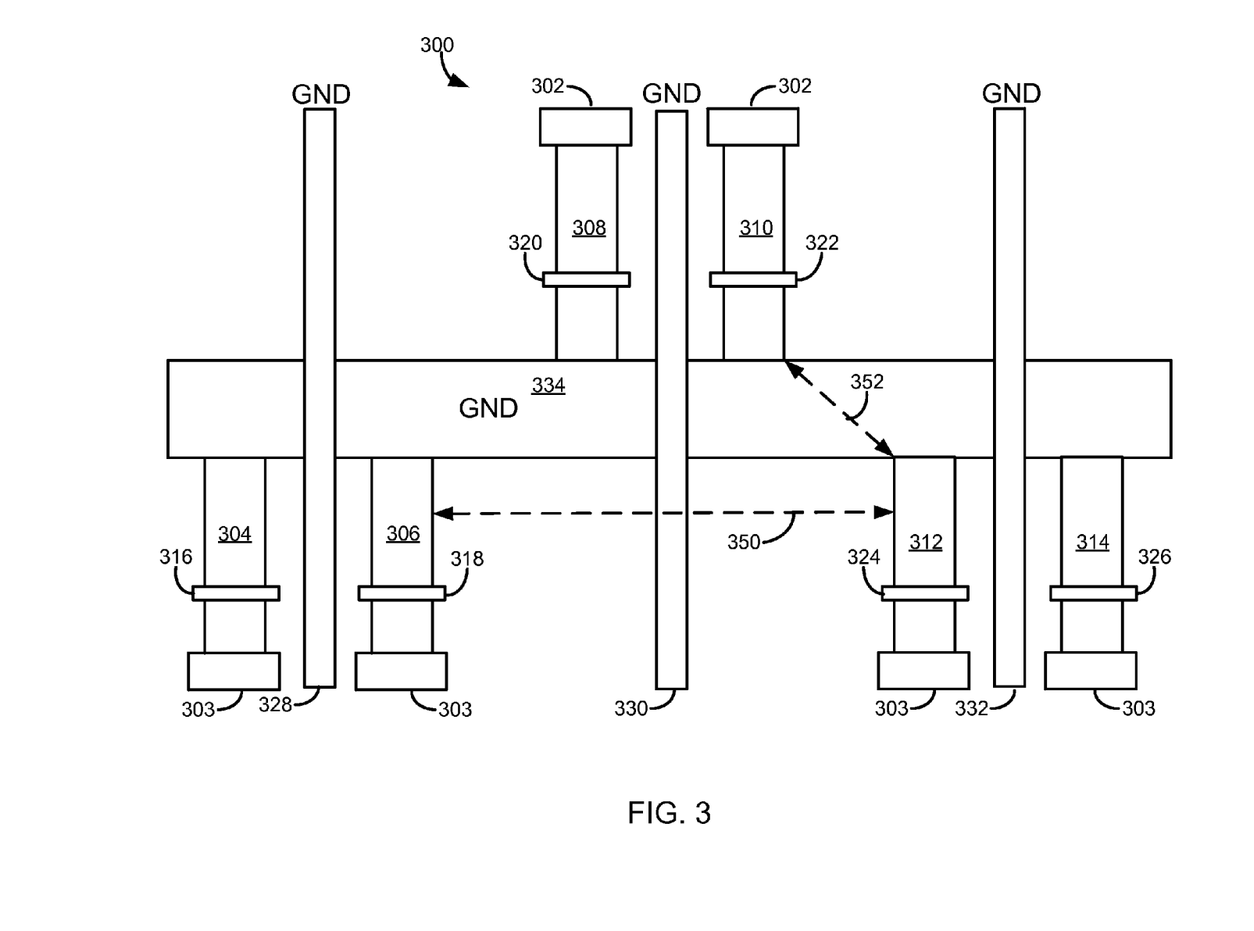
FIG. 3 is a cross-section view of the PCB of FIG. 2 illustrating the electrical effect on the PCB board of the large array layout of FIG. 2.

Through the arrangement of the blocking capacitor array of FIG. 2, the capacitive coupling within signals transmitted through the vias is significantly reduced. To illustrate this, FIG. 3 is a cross-section view of the PCB of FIG. 2 illustrating the electrical effect on the PCB board of the large array layout of FIG. 2. In particular, the PCB 300 of FIG. 3 is the same PCB 200 layout illustrated in FIG. 2. However, in this illustration, the back-drilling of the vias 304-314 has removed portions of each via. The effect of the arrangement of the blocking capacitors 302,303 and the back-drilling of the vias 304-314 on the capacitive coupling between the vias is thus discussed with reference to the PCB 300 of FIG. 3.

As shown in cross-coupling arrow 350, capacitive coupling between vias on the same side of the PCB 300 occurs over a large distance when compared with the embodiment illustrated in FIG. 1. In other words, vias that attempt to couple on the same side of the PCB 300 must do so at over twice the placement distance of the embodiment illustrated in FIG. 1. As mentioned above, blocking capacitors 302,303 are often placed on the PCB with 1 millimeter (mm) between them to account for the coupling between the vias. However, by removing portions of the via (through the back-drilling and alternating pattern of placement from the top side of the PCB 300 to the bottom side), the distance between the vias on the same side of the PCB is increased. Thus, the distance between blocking capacitor vias on the same side of the PCB increases to over 2 mm in the embodiment illustrated in FIG. 3. As such, this allows for a closer placement of the blocking capacitors and vias on the same side of the PCB 300 such that the blocking capacitors consume far less PCB surface space. In addition, the measured capacitive coupling in the signals carried by the vias decreases as the distance between the vias on the same side of the PCB 300 increases.

Another potential capacitive coupling may occur between vias over cross-coupling arrow 352. In this capacitive coupling, a via on the top side of the PCB 300 (such as via 310) may couple with a via on the bottom side of the PCB (such as via 312). However, to couple in this manner, the capacitive coupling may only occur diagonally across the ground plane 334. Because of the presence of the ground plane 334, such coupling is typically weak and may result in small amount of noise in the signals carried in the vias 310,312. In other words, although the top side via 310 and the bottom side via 312 may be physically closer together than vias on the same side of the PCB 300, the presence of the ground plane 334 further reduces the capacitive coupling between the vias on opposite sides of the PCB. In this manner, by alternating the blocking capacitors between the top side and the bottom side of the PCB, back-drilling the vias associated with the blocking capacitors, and orienting a ground plane between the top side capacitors and the bottom side capacitors, the capacitive coupling between the vias of the PCB may be reduced. Further, the blocking capacitors may be placed on the PCB closer together than conventional large array blocking capacitor arrangements, reducing the amount of PCB surface area used for the large array.

In addition, the placement of the ground vias 328-332 between a pair of signal vias may further aid in reducing the coupling between vias. For example, ground via 330 may provide a vertical reference current path for the top vias 302 from the top via pad down to the signal layer 320, 322. Simultaneously, the ground plane 334 further isolates one differential from another on the opposite side of the board. In particular, because the ground vias 328-332 are biased to ground along with the ground layer 334 of the board 300, top side vias 302 are isolated from bottom side vias 303 by the ground layer. Through the ground vias 328-332 and the ground layer 334, a ground-biased fence is placed around the top side vias, bottom side vias, and differential pairs of vias. Thus, by locating a ground via between pairs of signal vias and connecting those vias to the ground via layer 334, a further decrease in cross talk between the signal vias may be achieved through this ground via fencing.

Figure 4:
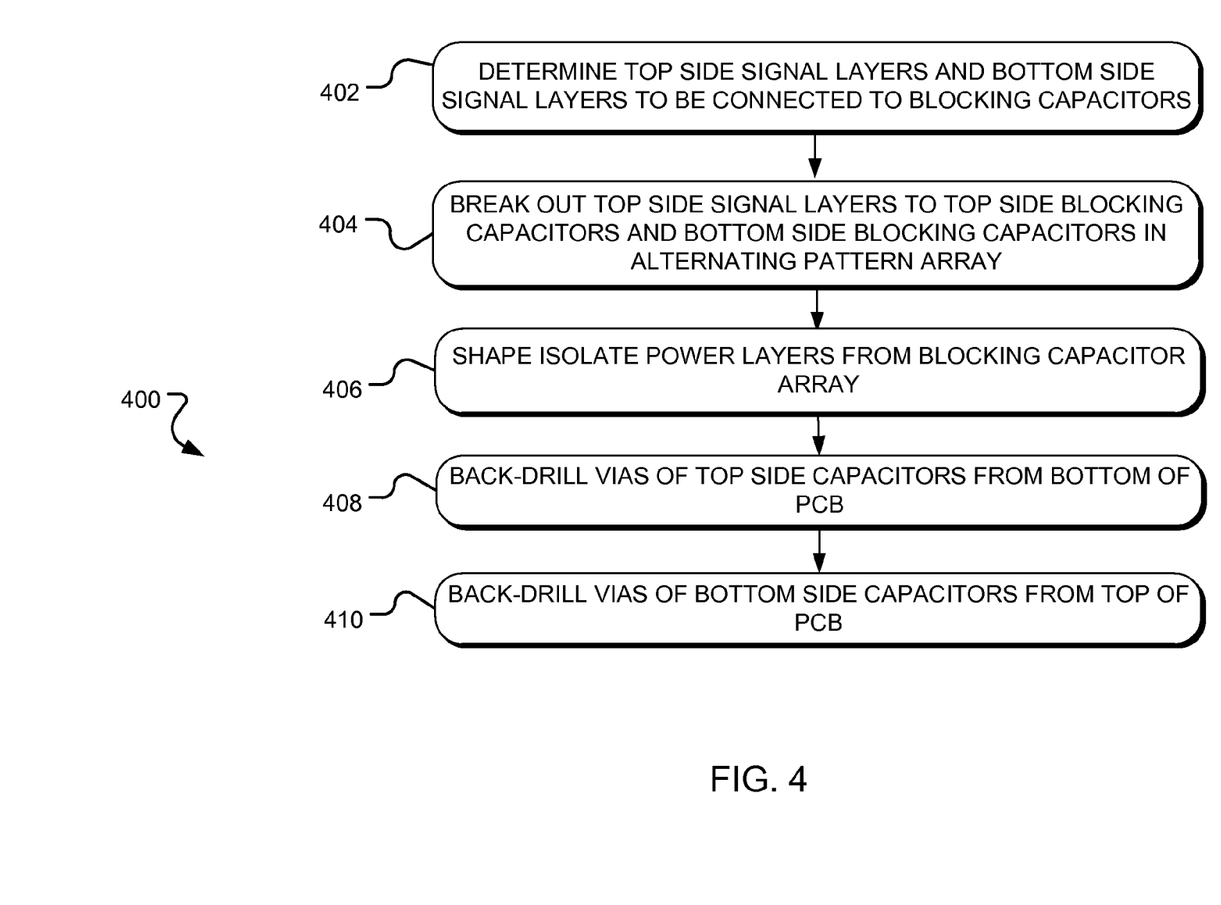
FIG. 4 is a flowchart of an example of a first method for arranging AC coupling/DC block capacitors on a PCB of a microelectronic circuit, according to one embodiment of the present disclosure.

FIG. 4 is a flowchart of an example of a first method 400 for arranging AC coupling/DC block capacitors on a PCB of a microelectronic circuit, according to one embodiment of the present disclosure. Through the operations of the flowchart 400 of FIG. 4, an arrangement of blocking capacitors of a microelectronic circuit similar to that illustrated in FIGS. 2 and 3 may be obtained. As such, the operations may be performed during a design phase of a PCB of a microelectronic circuit by a computing device, a PCB design tool, or a designer of the circuit. In the example of the method being performed by a computing device, the operations may be executed through one or more programs executed by the computing device, one or more hardware components of the computing device, or a combination of both hardware and software.

In operation 402, the computing device determines the top side signal layers to be connected to blocking capacitors. Using the embodiment shown in FIG. 2 as an example, the computing device determines that signal layer 220 and signal layer 222 are to be connected to one or more blocking capacitors 202. Also, because signal layer 220 and signal layer 222 are oriented in the top half of the PCB 200, the computing device determines that these signal layers are to be connected to one or more top side blocking capacitors 202. Also in operation 402, the computing device determines the bottom side signal layers to be connected to blocking capacitors. For example, the computing device determines that signal layer 216 of FIG. 2 and signal layer 218 are to be connected to one or more blocking capacitors 203. Because signal layer 216 and signal layer 218 are located in the bottom half of the PCB 200, the computing device determines that these signal layers are to be connected to one or more bottom side blocking capacitors 203.

Once determined, the computing device then provides a breakout for the top side signal layers to top side blocking capacitors and a breakout for the bottom side signal layers to bottom side blocking capacitors in operation 404. In one embodiment, the breakout of the signal layers to the blocking capacitors includes a via electrically connecting the signal layers to the corresponding blocking capacitor. Using the PCB 200 of FIG. 2 again, via 208 electrically connects top side signal layer 220 to top side blocking capacitor 202 and via 204 electrically connects bottom side signal layer 216 to bottom side blocking capacitor 203. In addition, the top side blocking capacitors and the bottom side capacitors may be placed on the PCB 200 in an alternating pattern of a pair of blocking capacitors on the top side, followed by a pair of blocking capacitors on the bottom side, and so on. For example, blocking capacitors 203 of the PCB 200 are located on the bottom side of the PCB, followed by blocking capacitors 202 on the top side of the PCB in an alternating pattern. This alternating pattern from the top side of the PCB 200 to the bottom side of the PCB aids in reducing the capacitive coupling between the vias associated with the blocking capacitors.

In operation 406, the computing device designs one or more of the power layers of the PCB to isolate the power layers from the area of the PCB that houses the large array of blocking capacitors. In one embodiment, the computing device shapes the power layer such that the power layer of the PCB 200 does not pass through the blocking capacitors large array area of the PCB design.

In operation 408, the computing device or computer designer back-drills the vias of the top side capacitors. For example, via 208 and via 210 of top side capacitors 202 may be back-drilled 238 from the bottom side of the PCB 200. As mentioned above, the back-drilling 238 from the bottom side of the PCB 200 may be deep enough into the PCB that the stub of the vias 208,210 does not extend past the center of the PCB. In one particular example, the back-drilling 238 may be to within 8 mils of the top side signal layers 220,222 of the top side blocking capacitor vias 208,210. Similarly, in operation 410, the computing device or computer designer back-drills the vias of the bottom side capacitors. For example, via 204 and via 206 of bottom side capacitors 203 may be back-drilled 236 from the top side of the PCB 200. Via 212 and via 214 of bottom side capacitors 203 may also be back-drilled 236 from the top side of the PCB 200. As mentioned above, the back-drilling 236 from the top side of the PCB 200 may be deep enough into the PCB that the stub of the vias 204,206 does not extend past the center of the PCB. In one particular example, the back-drilling 236 may be to within 8 mils of the bottom side signal layers 216,218 of the bottom side blocking capacitor vias 204,206.

Through the method 400 of FIG. 4, the AC coupling/DC blocking capacitors may be arrayed on the PCB in a dense array that saves board space while decreasing the capacitive coupling occurring in the signals carried on the PCB of the microelectronic circuit. In particular, by removing portions of the via (through the back-drilling and alternating pattern of placement from the top side of the PCB to the bottom side), the distance between the vias on the same side of the PCB is increased, allowing for a closer placement of the blocking capacitors and vias on the same side of the PCB such that the blocking capacitors consume far less PCB surface space.

Figure 5:
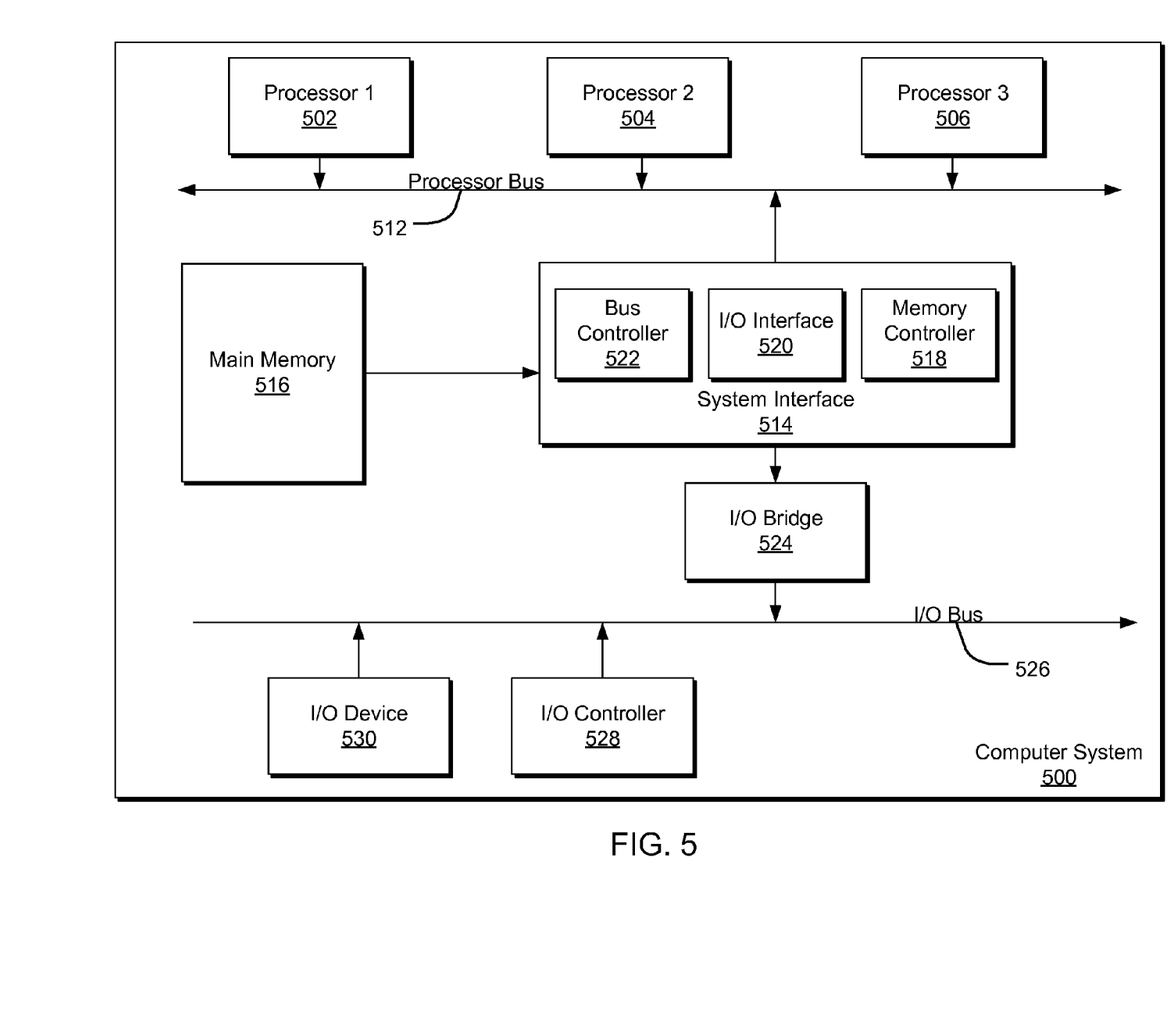
FIG. 5 is a block diagram illustrating an example of a computing system which may be used in implementing embodiments of the present disclosure.

FIG. 5 is a block diagram illustrating an example of a computing device or computer system 500 which may be used in implementing the embodiments of the PCB design disclosed above. The computer system (system) includes one or more processors 502-506. Processors 502-506 may include one or more internal levels of cache (not shown) and a bus controller or bus interface unit to direct interaction with the processor bus 512. Processor bus 512, also known as the host bus or the front side bus, may be used to couple the processors 502-506 with the system interface 514. System interface 514 may be connected to the processor bus 512 to interface other components of the system 500 with the processor bus 512. For example, system interface 514 may include a memory controller 518 for interfacing a main memory 516 with the processor bus 512. The main memory 516 typically includes one or more memory cards and a control circuit (not shown). System interface 514 may also include an input/output (I/O) interface 520 to interface one or more I/O bridges or I/O devices with the processor bus 512. One or more I/O controllers and/or I/O devices may be connected with the I/O bus 526, such as I/O controller 528 and I/O device 530, as illustrated.

I/O device 530 may also include an input device (not shown), such as an alphanumeric input device, including alphanumeric and other keys for communicating information and/or command selections to the processors 502-506. Another type of user input device includes cursor control, such as a mouse, a trackball, or cursor direction keys for communicating direction information and command selections to the processors 502-506 and for controlling cursor movement on the display device.

System 500 may include a dynamic storage device, referred to as main memory 516, or a random access memory (RAM) or other computer-readable devices coupled to the processor bus 512 for storing information and instructions to be executed by the processors 502-506. Main memory 516 also may be used for storing temporary variables or other intermediate information during execution of instructions by the processors 502-506. System 500 may include a read only memory (ROM) and/or other static storage device coupled to the processor bus 512 for storing static information and instructions for the processors 502-506. The system set forth in FIG. 5 is but one possible example of a computer system that may employ or be configured in accordance with aspects of the present disclosure.

According to one embodiment, the above techniques may be performed by computer system 500 in response to processor 504 executing one or more sequences of one or more instructions contained in main memory 516. These instructions may be read into main memory 516 from another machine-readable medium, such as a storage device. Execution of the sequences of instructions contained in main memory 516 may cause processors 502-506 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 516. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

It should be noted that the flowchart of FIG. 4 is illustrative only. Alternative embodiments of the present invention may add operations, omit operations, or change the order of operations without affecting the spirit and scope of the present invention. The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A printed circuit board (PCB) comprising:
   a top surface;
   a bottom surface opposite the top surface;
   a plurality of top side signal layers, the plurality of top side signal layers in an upper half of the PCB between the top surface and the bottom surface;
   a plurality of bottom side signal layers, the plurality of bottom side signal layers in a lower half of the PCB between the top surface and the bottom surface;
   a first pair of top side blocking capacitors on the top surface, the first pair of top side blocking capacitors electrically connected to a first pair of top side vias, wherein each of the first pair of top side vias electrically connects to at least one of the plurality of top side signal layers of the PCB;
   a pair of bottom side blocking capacitors on the bottom surface, the pair of bottom side blocking capacitors electrically connected to a pair of bottom side vias, wherein each of the pair of bottom side vias electrically connects to at least one of the plurality of bottom side signal layers of the PCB; and
   a second pair of top side blocking capacitors on the top surface, the second pair of top side blocking capacitors electrically connected to a second pair of top side vias, wherein each of the second pair of top side vias electrically connects to at least one of the plurality of top side signal layers of the PCB;
   wherein the first pair of top side blocking capacitors, the pair of bottom side blocking capacitors, and the second pair of top side blocking capacitors are arranged on the top surface and the bottom surface in an alternating pattern.

2. The PCB of claim 1 wherein the length of the first pair of top side vias and length of the second pair of top side vias is less than one-half the thickness of the PCB.

3. The PCB of claim 1 wherein the length of the pair of bottom side vias is less than one-half the thickness of the PCB.

4. The PCB of claim 2 wherein the length of the first pair of top side vias and length of the second pair of top side vias is determined by back-drilling the first pair of top side vias and the second pair of top side vias from the bottom surface of the PCB.

5. The PCB of claim 3 wherein the length of the pair of bottom side vias is determined by back-drilling the pair of bottom side vias from the top surface of the PCB.

6. The PCB of claim 1 further comprising a ground layer between the first pair of top side blocking capacitors and the bottom side blocking capacitors.

7. The PCB of claim 6 further comprising a power layer between the top surface of the PCB and bottom surface of the PCB, wherein the power layer is shaped such that the power layer is not located between the first pair of top side blocking capacitors and the bottom side blocking capacitors.

8. The PCB of claim 1 further comprising a first ground via between the first pair of top side blocking capacitors on the top surface of the PCB and a second ground via between the pair of bottom side blocking capacitors on the bottom surface of the PCB, the first ground via and the second ground via biased to a ground electrical signal.

9. A method for fabricating a printed circuit board (PCB), the method comprising:
   mounting a first pair of top side blocking capacitors on a top surface of the PCB, the first pair of top side blocking capacitors electrically connected to a first pair of top side vias, wherein each of the first pair of top side vias electrically connects to at least one of a plurality of top side signal layers, the plurality of top side signal layers in an upper half of the PCB between the top surface and a bottom surface opposite the top surface;
   mounting a pair of bottom side blocking capacitors on the bottom surface of the PCB, the pair of bottom side blocking capacitors electrically connected to a pair of bottom side vias, wherein each of the pair of bottom side vias electrically connects to at least one of the plurality of bottom side signal layers, the plurality of bottom side signal layers in a bottom half of the PCB between the top surface and a bottom surface;
   mounting a second pair of top side blocking capacitors on the top surface of the PCB, the second pair of top side blocking capacitors electrically connected to a second pair of top side vias, wherein each of the second pair of top side vias electrically connects to at least one of the plurality of top side signal layers; and
   wherein the first pair of top side blocking capacitors, the pair of bottom side blocking capacitors, and the second pair of top side blocking capacitors are mounted on the top surface and the bottom surface in an alternating pattern.

10. The method of claim 9 further comprising:
    back-drilling the first pair of top side vias and the second pair of top side vias from the bottom surface of the PCB.

11. The method of claim 10 wherein the length of the first pair of top side vias and length of the second pair of top side vias resulting from the back-drilling is less than one-half the thickness of the PCB.

12. The method of claim 9 further comprising:
back-drilling the pair of bottom side vias from the top surface of the PCB.

13. The method of claim 12 wherein the length of the pair of bottom side vias resulting from the back-drilling is less than one-half the thickness of the PCB.

14. The method of claim 9 further comprising:
providing a ground signal layer between the first pair of top side blocking capacitors and the bottom side blocking capacitors.

15. The method of claim 9 further comprising:
forming a power signal layer between the top surface of the PCB and bottom surface of the PCB, wherein the signal power layer is shaped such that the power layer is isolated from between the first pair of top side blocking capacitors and the bottom side blocking capacitors.

16. The method of claim 9 further comprising:
providing a first ground via between the first pair of top side blocking capacitors on the top surface and a second ground via between the pair of bottom side blocking capacitors on the bottom surface, the first ground via and the second ground via biased to a ground electrical signal.

17. A computer system comprising:
a circuit fabricated on a printed circuit board (PCB), the PCB comprising:
a top surface;
a bottom surface opposite the top surface;
a plurality of top side signal layers, the plurality of top side signal layers in an upper half of the PCB between the top surface and the bottom surface;
a plurality of bottom side signal layers, the plurality of bottom side signal layers in a lower half of the PCB between the top surface and the bottom surface;
a first pair of top side blocking capacitors on the top surface, the first pair of top side blocking capacitors electrically connected to a first pair of top side vias, wherein each of the first pair of top side vias electrically connects to at least one of the plurality of top side signal layers of the PCB;
a pair of bottom side blocking capacitors on the bottom surface, the pair of bottom side blocking capacitors electrically connected to a pair of bottom side vias, wherein each of the pair of bottom side vias electrically connects to at least one of the plurality of bottom side signal layers of the PCB; and
a second pair of top side blocking capacitors on the top surface, the second pair of top side blocking capacitors electrically connected to a second pair of top side vias, wherein each of the second pair of top side vias electrically connects to at least one of the plurality of top side signal layers of the PCB;
wherein the first pair of top side blocking capacitors, the pair of bottom side blocking capacitors, and the second pair of top side blocking capacitors are arranged on the top surface and the bottom surface in an alternating pattern.

18. The computer system of claim 17 wherein the length of the first pair of top side vias and length of the second pair of top side vias is less than one-half the thickness of the PCB and is formed by back-drilling the first pair of top side vias and the second pair of top side vias from the bottom surface of the PCB.

19. The computer system of claim 17 wherein the length of the pair of bottom side vias is less than one-half the thickness of the PCB and is formed by back-drilling the pair of bottom side vias from the top surface of the PCB.

20. The computer system of claim 17 wherein the PCB further comprises a ground layer between the first pair of top side blocking capacitors and the bottom side blocking capacitors.

\* \* \* \* \*